(12) United States Patent
Ojo et al.

(10) Patent No.: US 8,190,115 B2
(45) Date of Patent: May 29, 2012

(54) TRANSMISSION LINE COUPLED TO CIRCUITS AND Q-ENHANCEMENT CELL

(75) Inventors: Adedayo Ojo, San Diego, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/984,758

(22) Filed: Jan. 5, 2011

(65) Prior Publication Data

US 2011/0095812 A1 Apr. 28, 2011

Related U.S. Application Data

(62) Division of application No. 11/510,373, filed on Aug. 25, 2006, now Pat. No. 7,885,629.

(60) Provisional application No. 60/835,482, filed on Aug. 3, 2006.

(51) Int. Cl.
*H04B 1/10* (2006.01)

(52) U.S. Cl. ......... 455/307; 455/333; 455/302; 333/193

(58) Field of Classification Search .................. 455/307, 455/333, 302, 323; 333/195, 175, 176; 330/305, 330/260, 261
See application file for complete search history.

(56) References Cited

U.S. PATENT DOCUMENTS

| | | | |
|---|---|---|---|
| 4,843,343 A | 6/1989 | Pace | |
| 6,157,822 A * | 12/2000 | Bastani et al. | 455/323 |
| 6,518,859 B1 * | 2/2003 | Spampinato | 333/174 |
| 6,618,276 B2 * | 9/2003 | Bennett | 363/56.02 |
| 6,621,331 B2 | 9/2003 | Pobanz et al. | |
| 6,621,390 B2 * | 9/2003 | Song et al. | 335/78 |
| 6,664,843 B2 * | 12/2003 | Dasgupta et al. | 327/512 |
| 6,693,573 B1 * | 2/2004 | Linder | 341/143 |
| 6,724,259 B2 | 4/2004 | Tanabe | |
| 6,765,377 B1 | 7/2004 | Lu | |
| 6,838,951 B1 * | 1/2005 | Nieri et al. | 331/177 V |
| 6,862,302 B2 * | 3/2005 | Chieng et al. | 372/29.02 |
| 6,870,447 B2 | 3/2005 | Kawai | |
| 6,917,138 B2 * | 7/2005 | Nguyen | 310/311 |
| 6,940,358 B1 * | 9/2005 | Meacham | 331/117 R |
| 6,973,288 B1 * | 12/2005 | Davis et al. | 455/67.11 |
| 6,990,327 B2 * | 1/2006 | Zheng et al. | 455/307 |
| 7,042,317 B2 | 5/2006 | Xiao et al. | |
| 7,048,438 B2 * | 5/2006 | Breinlinger | 374/178 |
| 7,221,924 B2 * | 5/2007 | Zheng et al. | 455/307 |
| 7,259,625 B2 | 8/2007 | Sanderson | |
| 7,400,203 B2 * | 7/2008 | Ojo et al. | 330/305 |
| 7,505,749 B2 * | 3/2009 | Darabi et al. | 455/258 |
| 7,522,017 B1 * | 4/2009 | Groe et al. | 333/175 |
| 7,885,629 B2 * | 2/2011 | Ojo et al. | 455/307 |
| 2003/0054783 A1 | 3/2003 | Mason | |
| 2004/0219900 A1 * | 11/2004 | Zheng et al. | 455/302 |
| 2005/0184314 A1 | 8/2005 | Titus et al. | |
| 2006/0050539 A1 * | 3/2006 | Yang et al. | 363/21.16 |

(Continued)

OTHER PUBLICATIONS

Office Action Response filed for U.S. Appl. No. 11/510,373, filed on Sep. 21, 2010, 9 pages.

(Continued)

*Primary Examiner* — Minh D Dao

(74) *Attorney, Agent, or Firm* — Brake Hughes Bellermann LLP

(57) ABSTRACT

Various example embodiments are disclosed. According to an example embodiment, an apparatus may comprise a first circuit, a second circuit, a transmission line coupled between the first circuit and the second circuit, and a Q-enhancement cell coupled to the transmission line.

16 Claims, 8 Drawing Sheets

U.S. PATENT DOCUMENTS

| | | | | |
|---|---|---|---|---|
| 2006/0094381 | A1* | 5/2006 | Darabi et al. | 455/168.1 |
| 2006/0154638 | A1* | 7/2006 | Zheng et al. | 455/302 |
| 2008/0030279 | A1* | 2/2008 | Ojo et al. | 330/305 |
| 2008/0032661 | A1* | 2/2008 | Ojo et al. | 455/333 |
| 2009/0074048 | A1* | 3/2009 | Amin et al. | 375/229 |
| 2009/0181631 | A1* | 7/2009 | Darabi et al. | 455/258 |
| 2010/0330948 | A1* | 12/2010 | Judson et al. | 455/334 |
| 2011/0212692 | A1* | 9/2011 | Hahn et al. | 455/63.1 |

OTHER PUBLICATIONS

Office Action Response filed for U.S. Appl. No. 11/510,373, filed on May 20, 2010, 14 pages.

Kulyk, Jim M., "A Monolithic CMOS Transformer Based Q-Enhanced Series-C Coupled Resonator Bandpass Filter", The University of Calgary, Calgary, Alberta, A Thesis Submitted to the Faculty of Graduate Studies in Partial Fulfillment of the Requirements for the Degree of Master of Science, Department of Electrical and Computer Engineering,(Jan. 2006), 150 pages.

U.S. Appl. No. 11/510,373 Final Office Action mailed Aug. 5, 2010, 11 pages.

U.S. Appl. No. 11/510,373 Notice of Allowance mailed Sep. 30, 2010, 6 pages.

U.S. Appl. No. 11/510,373 Final Office Action mailed Jan. 19, 2010, 10 pages.

* cited by examiner

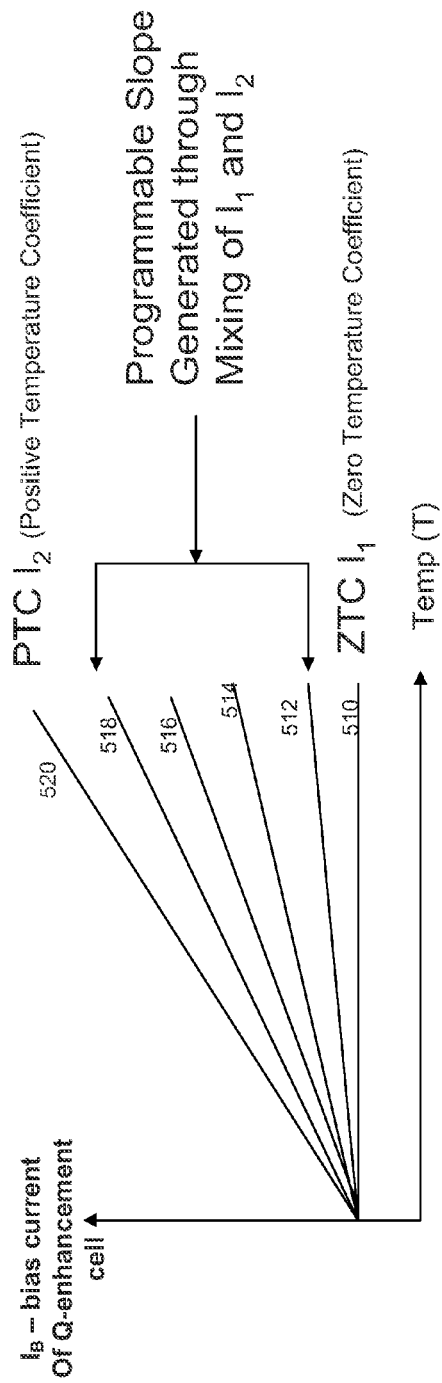
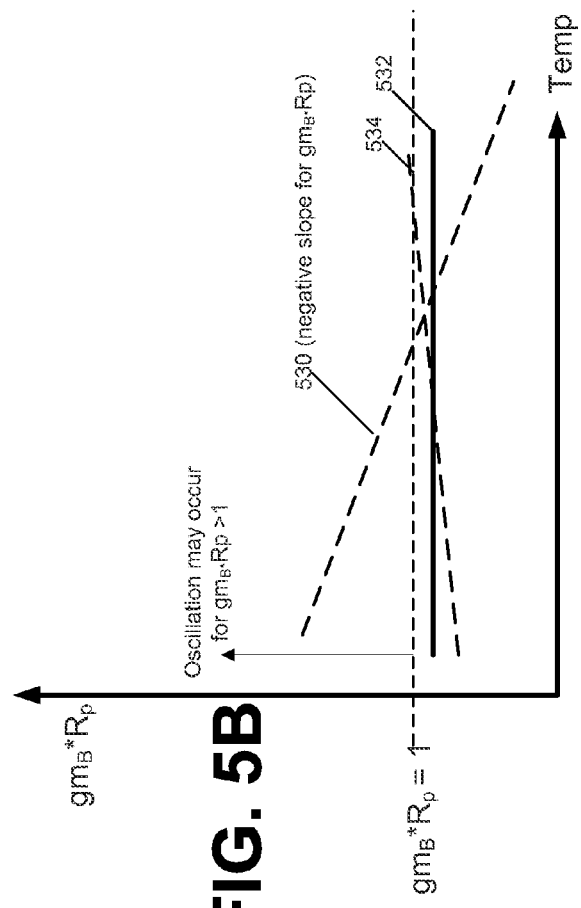
FIG. 5A
FIG. 5B

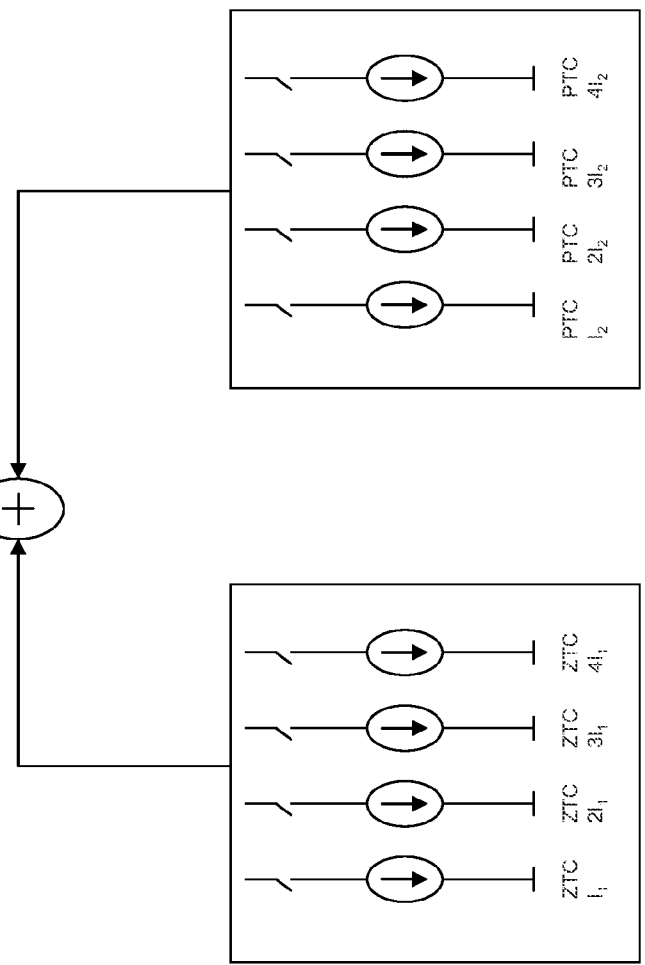

Mixing or combining weighted combinations of $I_1$ and $I_2$ may allow generation of various bias current slopes for a Q-enhancement cell, e.g., bias current slopes between ZTC (such as, for example, constant slope with temp. e.g., which may be referred to as a zero temp. coefficient) and PTC (such as a relatively high pos. slope, which may be referred to as a positive temp. coefficient)

FIG. 6

TRANSMISSION LINE COUPLED TO CIRCUITS AND Q-ENHANCEMENT CELL

CROSS-REFERENCE TO RELATED APPLICATIONS

This application is a divisional of U.S. patent application Ser. No. 11/510,373 filed, on Aug. 25, 2006, entitled "Circuit with Q-Enhancement cell Having Programmable Bias Current Slope", which claims priority to U.S. Provisional application Ser. No. 60/835,482, filed on Aug. 3, 2006, entitled "Circuit with Q-Enhancement cell Having Programmable Bias Current Slope," the disclosures of both of which are hereby incorporated by reference.

BACKGROUND

Wireless transceivers and other circuits are used in a wide variety of wireless and communication systems. A wireless transceiver may typically include a wireless receiver for receiving and demodulating signals, and a transmitter for modulating signals for transmission. The transceiver may typically include a variety of RF (radio frequency) circuits, such as amplifiers, mixers, filters, LO (local oscillator) circuits, etc. Many of these circuits may include an inductor or an inductor as a load. One of the performance characteristics of an RF circuit may be determined in part by the quality factor (Q) of the inductor. A higher Q often provides higher gain, lower Noise Figure, lower power consumption to name a few. However, in some cases, the circuit area is often times dominated by the size of the inductors (e.g., inductor-to-device ratio may be, for example, 3:1 or 4:1, in terms of size, in some cases). Therefore, a higher Q for an inductor may be obtained typically at the expense of a larger circuit area. A limited circuit area may constrain the size of the inductors, which therefore typically limits the Q of the inductor. Unfortunately, this limit may significantly inhibit the gain or performance of a circuit.

SUMMARY

Various embodiments are disclosed relating to Q-enhancement cells.

According to an example embodiment, a circuit may include an inductor with a quality factor (Q), and a Q-enhancement cell coupled to the inductor. The Q-enhancement cell may include a current source having a variable bias current slope. In one embodiment, a programmable current source may be programmed to one of a plurality of bias current slopes versus temperature based on a received digital control signal. In another example embodiment, the current source for the Q-enhancement cell may include a first bias current source having a first bias current slope and a second bias current source having a second bias current slope. In an example embodiment, the current outputs from the first bias current source and the second bias current source may be configured to be combined or added in a weighted manner to generate various programmable bias current slopes for the Q-enhancement cell.

According to another example embodiment, a method is provided. The method may include providing a circuit including a Q-enhancement cell, and selecting one of a plurality of bias current slopes for the Q-enhancement cell. In an example embodiment, the selecting may include selecting a bias current slope for the Q-enhancement cell to provide a substantially stable operation across a range of temperatures.

In another example embodiment, a circuit is provided. The circuit may include one or more switched capacitors that may be configured to select one of a plurality of channels, an inductor with a quality factor (Q), and a Q-enhancement cell coupled to the inductor. The Q-enhancement cell may include a current source having a variable bias current, the Q-enhancement cell being configured to compensate for a Q degradation due to the one or more switched capacitors.

In another example embodiment, a method is provided. The method may include selecting a channel for circuit operation by configuring one or more switched capacitors, and configuring a Q-enhancement cell to compensate for a Q degradation due to the configuring of the one or more switched capacitors.

In another example embodiment, an apparatus is provided. The apparatus may include a first circuit, a second circuit, a transmission line coupled between the first circuit and the second circuit, and a Q-enhancement cell coupled to the transmission line. In an example embodiment, the Q-enhancement cell may compensate for a Q degradation caused by the transmission line or transmission line losses.

In yet another example embodiment, a method may be provided. The method may include providing a transmission line between first and second circuits, and compensating for Q degradation due to the transmission lines by using a Q-enhancement cell coupled to the transmission line.

BRIEF DESCRIPTION OF THE DRAWINGS

FIG. 5A is a diagram illustrating different bias current ($I_B$) slopes of a Q-enhancement cell according to an example embodiment.

FIG. 5B is a diagram illustrating slopes of $g_{mB}$*Rp for a Q-enhancement cell according to an example embodiment.

FIG. 6 is a diagram illustrating a variable or programmable bias current source for a Q-enhancement cell, in which a variable bias current slope may be provided.

DETAILED DESCRIPTION

Figure 1:
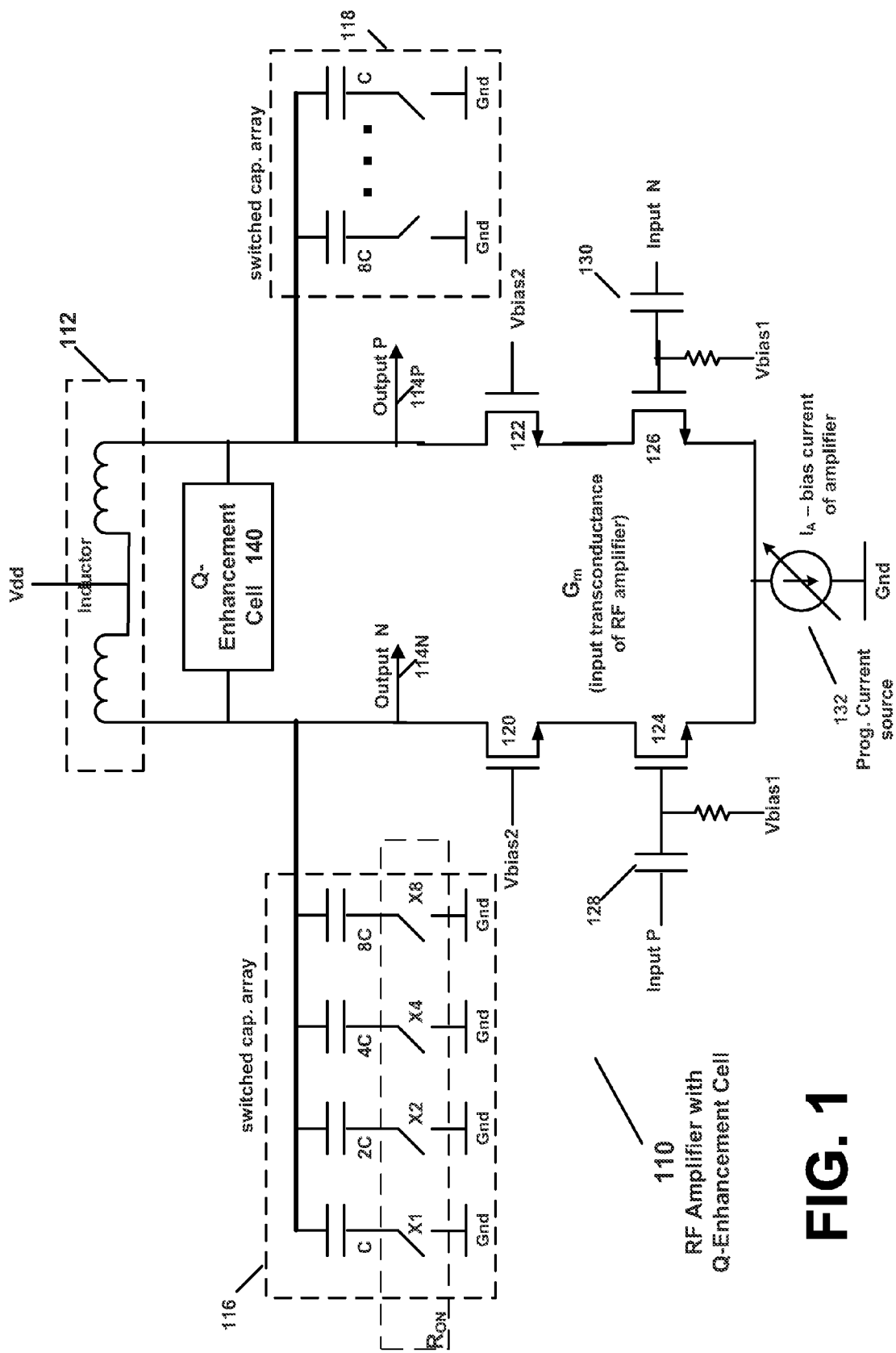
FIG. 1 is a block diagram of an amplifier circuit according to an example embodiment.

FIG. 1 is a block diagram of an amplifier circuit according to an example embodiment. The amplifier 110 in FIG. 1 is merely an example circuit used to illustrate some operation and features of an example embodiment. The various techniques and features described in this disclosure may apply to a wide variety of circuits, and an amplifier is merely one example circuit where these techniques may be applied.

Amplifier 110 may be a differential amplifier, e.g., may include differential (e.g., positive and negative) inputs and may include differential outputs, in an example embodiment. Amplifier 110 may include cascode devices or transistors 120 and 122. A bias voltage (Vbias2) may be applied to the gates of both cascode transistors 120 and 122. Amplifier 110 may also include a transistor 128 coupled in series with cascode transistor 120, and a transistor 126 coupled in series with cascode transistor 122. A positive input (input P) may be applied to the gate of transistor 124 via a capacitor 128. A bias voltage (Vbias1) is also applied to the gate of transistor 124 via a resistor. Similarly, a negative input (input N) is applied to the gate of transistor 126 via a capacitor 130. A bias voltage (Vbias1) is applied to the gate of transistor 126 via a resistor. Transistors 120, 122, 124, and 126 may be MOSFETs (Metal Oxide Semiconductor Field-Effect Transistors), according to an example embodiment.

In addition, the amplifier 110 may include a variable or programmable current source 132 coupled in series between transistors 124/126 and ground. The current source 132 may provide a variable bias current $I_A$ for the amplifier 110. According to an example embodiment, current source 132 may be implemented, for example, as an IDAC (or programmable current digital-to-analog converter), which may receive a digital control signal and generate a current, $I_A$, based on the digital control signal. Other implementations may be used as well.

Switched capacitor arrays 116 and 118 may be coupled to output lines 114N and 114P, respectively, to provide variable capacitors. Switched capacitor arrays 116, 118 may each include one or more switched capacitors (e.g., one or more capacitors coupled to ground via a switch), to allow the amplifier to be tuned to operate at one of a plurality of channels or center frequencies, for example.

For example, as shown in FIG. 1, switched capacitor array 116 may include a capacitor of capacitance C coupled to ground via a switch X1, a capacitor of capacitance 2C coupled to ground via a switch X2, a capacitor of capacitance 4C coupled to ground via a switch X4, and a capacitor of capacitance 8C coupled to ground via a switch X8. This may be considered a binary weighted capacitor array, where a wide range of capacitance values may be obtained by selectively opening and closing switches X1, X2, X4, X8, e.g., based on a digital control signal. Each of the switches may be implemented as a MOS (metal oxide semiconductor) transistor, for example. As a result, each of the switches may introduce a resistance when closed or On, and the total resistance of the group of one or more On switches may be referred to as $R_{ON}$. Capacitor array 118 may be the same or similar to the capacitor array 116, according to an example embodiment.

In addition, the amplifier 110 may include an inductor 112, which may be a differential inductor to operate as an inductor load for amplifier 112, for example. Inductor 112 may include an inductance L, and a Quality Factor (Q). The inductor 112 may include a loss component (as part of the inductor) that may be shown as a resistor (or resistance), which may be referred to as Rp, e.g., which may reflect a resistance in parallel with the inductance L for inductor 112.

In operation of amplifier 110, transistors 124 and 126 may provide amplification of input signals (input P, input N), and may output a differential output signals, including a negative output (output N) via line 114N, and a positive output (output P) via line 114P. Cascode transistors 120 and 122 may provide isolation between the input and output terminals. Transistors 124 and 126 may operate as a transconductor. The amplifier 110, via transistors 124 and 126, and current source 132, may include an input transconductance, referred to as Gm.

A transconductor, Gm, may, for example, generate an output current based on an input voltage, such as: $I_{out}=V_{in}*Gm$.

The gain of amplifier 110 may be represented as: Gain=Gm*Rp, where Gm is the input transconductance of the amplifier and Rp is the equivalent parallel resistance due to the resistive loss of the inductor 112.

In an example embodiment, it may be desirable to increase a gain of the amplifier, e.g., double the gain. This is merely an example. The size of the inductor 112 may be set or limited by the chip area. In an example embodiment, as a rough approximation, a Q of inductor 112 may be roughly proportional to the size of inductor 112. This inductor size may therefore set the Q (or Quality Factor) for inductor 112.

The parallel resistance of the inductor, Rp, may be represented as: Rp=QwL, where Q is the Quality Factor of the inductor 112, w is the operating frequency, and L is the inductance of the inductor 112. Therefore, the Q and L of the inductor 112 may be fixed (or may not typically be increased), e.g., due to space constraints for the circuit. Another way to represent this, is first one may select an inductance value or L. Next, the Q will be set based on a size of the inductor. Because the operating frequency is set (e.g., constant or within a range of frequencies), the Rp for the inductor is therefore fixed, in this example.

In addition, the input transconductance (Gm) of the amplifier 110 may be roughly proportional to the square root of the amplifier bias current ($I_A$), for example. Therefore, if in this example, the Rp is fixed, the gain of the amplifier can be increased by increasing the Gm. For example doubling the amplifier Gain may be achieved by doubling the Gm. E.g., doubling the Gm may double the Gain of the amplifier 110, which may be represented as: 2*Gm->2*Gain. However, because the Gm may be roughly proportional to the square root of the amplifier bias current ($I_A$), doubling the Gm may be achieved by quadrupling the bias current ($I_A$). For example: 2*Gm may be achieved by 4*$I_A$. Quadrupling the bias current of the amplifier may be done, in some situations, but may typically lead to the undesirable result of significantly increasing power consumption for the amplifier. For example, in such a case, a 2 mA bias current (as an example) may be quadrupled to 8 mA, which may be an undesirable result for low power applications. Thus, if possible, at least in some situations, it may be more desirable to increase the Gm without significantly increasing the bias current ($I_A$).

Therefore, it is desirable to increase the Q of the inductor (e.g., to increase Gain or performance), but there may be a limited size or circuit area for the inductor that may typically constrain or limit Rp for the inductor. Therefore, as noted above, one way to increase the Gain may be through increasing the Gm (e.g., by increasing the bias current), but this may have an undesirable effect of increasing power.

Therefore, according to an example embodiment, the Q of the inductor 112 may be increased or enhanced by using a Q-enhancement device 140 to increase the effective resistance of the inductor 112 or the circuit.

When the Q-enhancement cell 140 is coupled to the amplifier 110, e.g., across the differential outputs 114N and 114P of the amplifier 110, the effective Gain (or enhanced Gain) of amplifier 110 may be represented as: $Gain_{eff}=Gm*R_{eff}$, where $R_{eff}$ is the effective resistance from Rp in combination with the Q-enhancement cell 140. By adding the additional resistance provided by the Q-enhancement cell 140, the overall Q for the amplifier 110 may be increased. Thus, by coupling the Q-enhancement cell 140 to the outputs of the amplifier 110, the effective output resistance ($R_{eff}$) of the amplifier is increased, which increases the amplifier Gain, e.g., without drastically increasing the bias current $I_A$.

As noted above, the Gain of the amplifier 110 may be represented as: Gain=Gm*Rp. The enhanced or effective Gain of the amplifier with the benefit of the Q-enhancement device may be represented as $Gain_{eff}=Gm*R_{eff}$, where $R_{eff}$ is the effective resistance from Rp in combination with the Q-enhancement cell 140. For the new or effective Gain (with Q-enhancement cell 140) to be, say, twice as much as the original Gain (without Q-enhancement cell), then the effective resistance ($R_{eff}$) of the inductor 112 should be twice as much as the original parallel resistance (Rp) of the inductor 112. This may be represented as $R_{eff}=2*Rp$.

According to an example embodiment, the Q-enhancement cell 140 may be provided as a negative Gm (NEG-Gm) cell, having a negative resistance that may be represented as: $-1/g_{mB}$, where $g_{mB}$ is the transconductance of the NEG-Gm cell (or Q-enhancement cell 140). Therefore, in an example embodiment, when the Q-enhancement cell, having a resistance of: $-R=-1/g_{mB}$ is placed in parallel to the inductor resistor Rp, the effective resistor (or effective resistance) may be represented as: $R_{eff}=Rp//[-R]$, where $-R=-1/g_{mB}$. Thus, solving for $R_{eff}$ provides: $R_{eff}=Rp/(1-g_{mB}*Rp)$. If, for example, the effective resistance $R_{eff}$ will be twice the resistance of Rp (e.g., in order to provide twice the gain), then: $R_{eff}=Rp/(1-g_{mB}*Rp)=2Rp$. This equation may be solved to obtain a transconductance of $g_{mB}=\frac{1}{2}Rp$. This value of transconductance of the Q-enhancement cell 140 may be obtained by using or selecting a bias current of the Q-enhancement cell 140, e.g., around 200 μA-400 μA, as an example. This is described in more detail below with respect to FIG. 2.

Thus, the Gain of the amplifier 110 may be doubled by using a Q-enhancement cell, with the additional cost of a small current increase, e.g., 200 μA-400 μA, which is a much smaller current increase than quadrupling the amplifier bias current $I_A$, e.g., from 2 mA to 8 mA, as an example.

Figure 2:
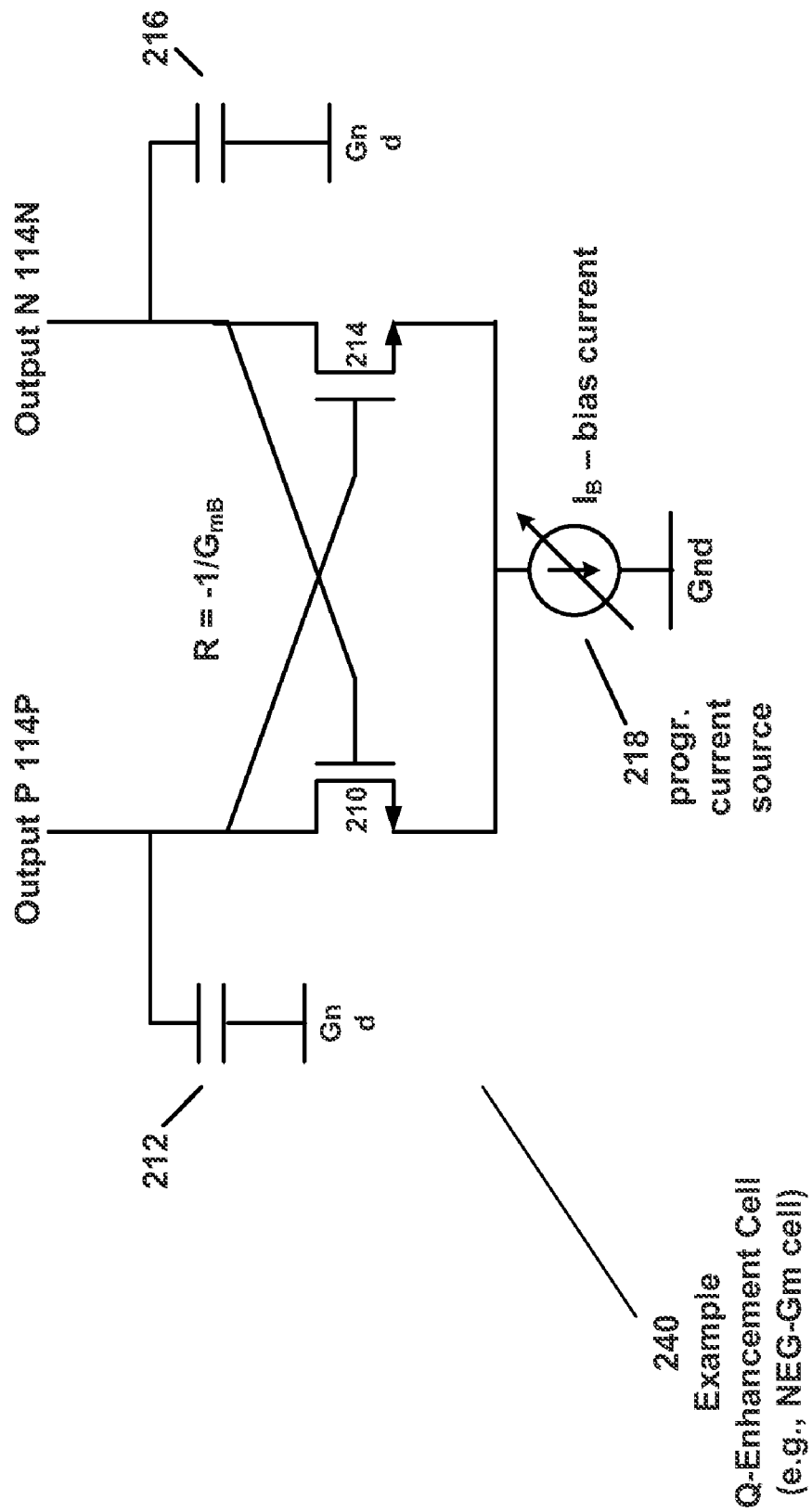
FIG. 2 is a diagram illustrating a Q-enhancement cell according to an example embodiment.

FIG. 2 is a diagram illustrating a Q-enhancement cell according to an example embodiment. Q-enhancement cell 140 may be, for example, a negative Gm (NEG-Gm) cell 240, which is shown in FIG. 2, according to an example embodiment. The NEG-Gm cell 240 is coupled between differential outputs 114P, 114N. Differential outputs 114P and 114N may be coupled to ground via capacitors 212 and 216, respectively. NEG-Gm cell 240 may include transistors 210 and 214 coupled in parallel. Gates of transistors 210 and 214 may be cross-coupled to outputs 114N and 114P, respectively. Transistors 210 and 214 are coupled to a programmable current source 218. As noted above, the NEG-Gm cell 240 may include a resistance $R=-1/g_{mB}$, for example. This illustrates an example of a Q-enhancement cell, and other Q-enhancement cells may be used.

Figure 3:
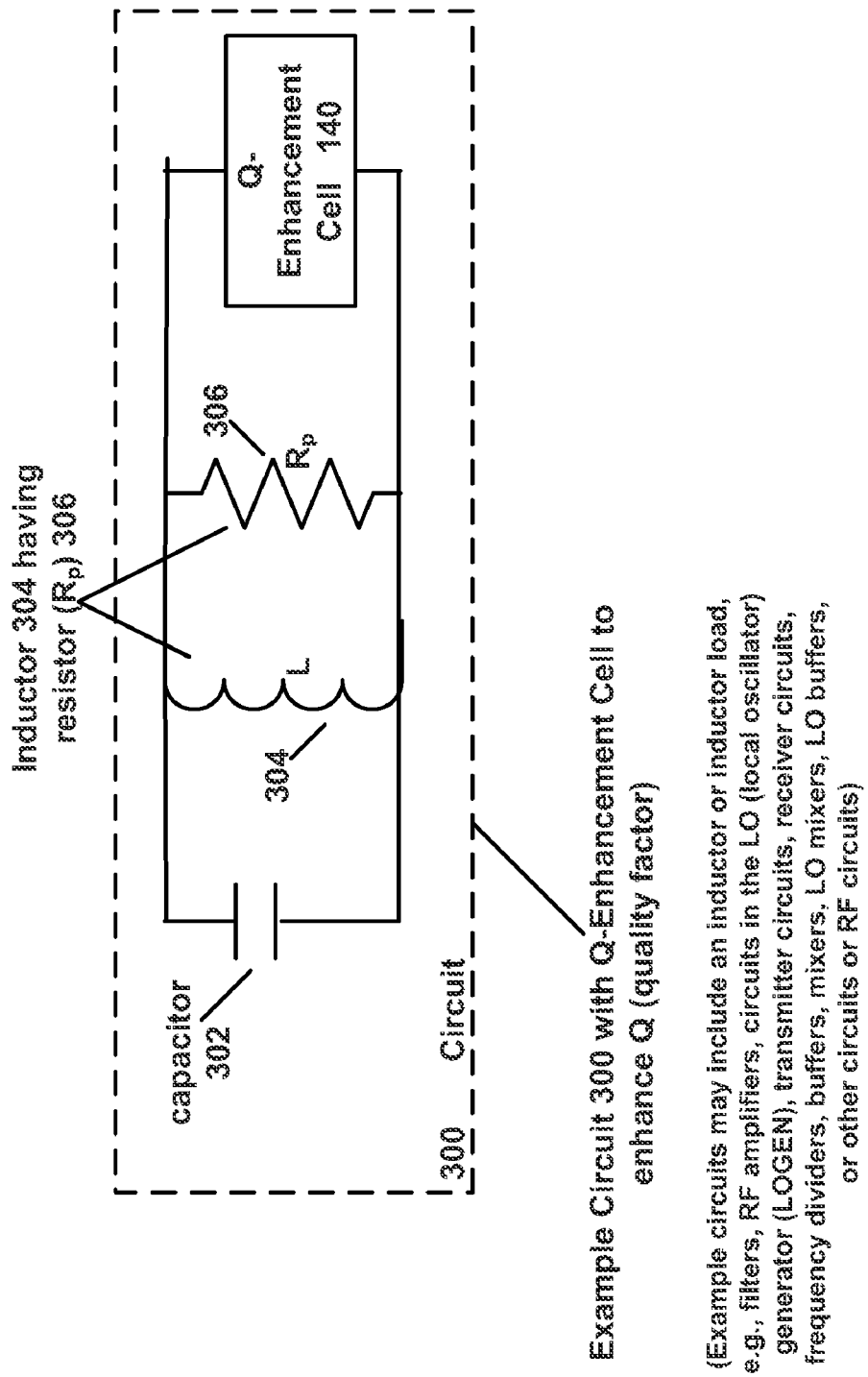
FIG. 3 is a block diagram of a circuit with a Q-enhancement cell.

FIG. 3 is a block diagram of a circuit with a Q-enhancement cell. Circuit 300 may be any type of circuit or RF circuit, e.g., a circuit that may include an inductor or inductor load. Circuit 300 may be, for example, a filter, an RF amplifier, a local oscillator (LO) generator (or LOGEN) circuit or circuits within a LOGEN, a wireless transmitter circuit, a wireless receiver circuit, a frequency divider, a buffer, a mixer, a LO buffer, or other circuit. Circuit 300 may include, for example, a capacitor 302 and an inductor 302 (L) with a resistance Rp 306. Many RF circuits, for example, are loaded with an L-C tank, such as that shown in FIG. 3.

The circuit 300 in FIG. 3 may also include a Q-enhancement cell 140. Q-enhancement cell 140 may be a NEG-Gm cell, according to an example embodiment. In an example embodiment, by coupling the Q-enhancement cell 140 to the outputs of the circuit 300, the effective output resistance of the circuit may be increased, which may increase the Q of the circuit, for example. Thus, using a Q-enhancement cell 140 may allow a circuit to provide an increased Q, or may allow a smaller inductor to be used (e.g., having a smaller Q) while providing about the same overall Q by increasing or boosting the Q by using the Q-enhancement cell. Thus, in an example embodiment, the Q-enhancement cell 140 may provide a low-current and low-power solution while saving chip area for a circuit, such as for RF circuits, circuits in a LOGEN path, or other circuits. The Q-enhancement cell 140 may be used in a wide variety of circuits.

One issue that may arise, e.g., for some circuits where a Q-enhancement cell may be used, is possible instability. As noted above, the effective output resistance of the circuit, including Rp in parallel with the Q-enhancement cell 140, may be represented as $R_{eff}=Rp/(1-g_{mB}*Rp)$. The circuit and/or Q-enhancement cell 140 may become unstable (e.g., oscillate) where the denominator of this equation ($1-g_{mB}*Rp$) is less than zero. Thus, to avoid oscillation or instability, the product $g_{mB}*Rp$ may preferably be, for example, less than 1, e.g., across a range of operational temperatures. This may be represented as $g_{mB}*Rp<1$. This is merely an example, e.g., with respect to the examples illustrated above, and other numbers or parameter values may be used to provide an indication of stability, for example.

Figure 4B:
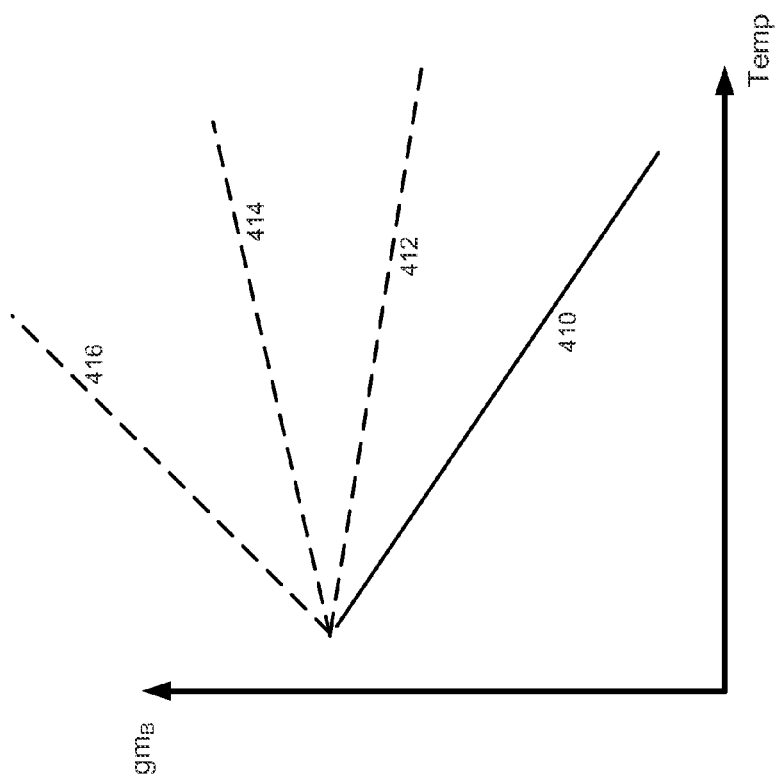
FIG. 4B is a diagram illustrating a slope of the transconductance ($g_{mB}$) of the Q-enhancement cell versus temperature according to an example embodiment.
Figure 4A:
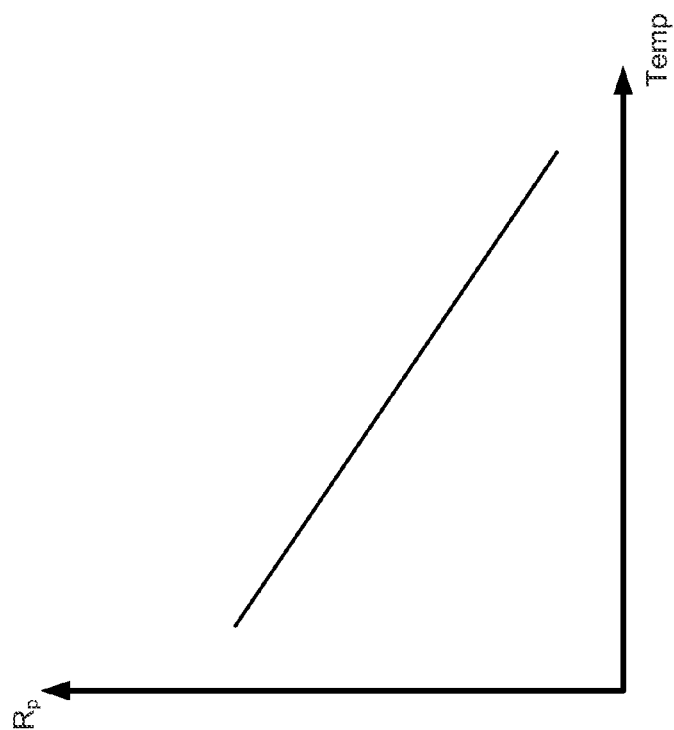
FIG. 4A is a diagram illustrating a slope of resistance Rp versus temperature according to an example embodiment.

FIG. 4A is a diagram illustrating a slope of resistance Rp versus temperature according to an example embodiment. The Rp may be the resistance of an inductor. As shown in FIG. 4A, the resistance of Rp may be inversely proportional to temperature, thus a negative slope is shown. This type of behavior or negative slope may be fundamental or a characteristic of an inductor, for example.

FIG. 4B is a diagram illustrating a slope of the transconductance ($g_{mB}$) of the Q-enhancement cell versus temperature according to an example embodiment. Slope 410 is a negative slope, and may reflect the natural tendency of the transconductance in some cases, which is shown as a negative slope, or inversely proportional to temperature. Thus, in such a case with a negative slope for Rp (FIG. 4A) and a negative slope for $g_{mB}$, this may provide a negative slope for the product $g_{mB}*Rp$ (not shown in FIG. 4B). Such a significant negative slope for $g_{mB}*Rp$ may, for some relatively low temperatures, cause $g_{mB}*Rp$ to be greater than 1, thereby possibly causing oscillation or instability for the circuit or Q-enhancement cell. However, by adjusting the bias current ($I_B$) slope of the Q-enhancement cell 140 (or NEG-Gm cell), different slopes for $g_{mB}$ may be obtained, such as slopes 412, 414, 416, etc. If the slope of $g_{mB}$ is positive or reaches a specific value (which may be positive or some other slope value), the product of $g_{mB}*Rp$ may be a positive or substantially constant value or a value that may result in a more stable operation (or substantially stable operation) of the circuit or Q-enhancement cell over a range of temperatures. For example, the product of the slope 416 of $g_{mB}$ (FIG. 4B) and Rp (FIG. 4A) may provide a substantially constant $g_{mB}*Rp$ product, or a $g_{mB}*Rp$ product that may result in a more stable circuit operation over a wider range of temperatures, for example.

FIG. 5A is a diagram illustrating different bias current ($I_B$) slopes of a Q-enhancement cell according to an example embodiment. For example, a bias current slope 510 may correspond to a zero temperature coefficient (ZTC) or a substantially constant value versus temperature. The bias current ($I_B$) from the Q-enhancement cell 140 that may provide the ZTC slope 510 may be referred to as $I_1$. As another example, a bias current slope 520 may correspond a positive temperature coefficient (PTC), or a positive slope versus temperature. The bias current that may provide the PTC slope 520 may be referred to as $I_2$.

In an example embodiment, the bias current, $I_B$, of Q-enhancement cell 140 may be variable or programmable, to thereby adjust the value of the transconductor value or transconductance $g_{mB}$ of the Q-enhancement cell 140.

According to an example embodiment, the bias currents $I_1$ and $I_2$, corresponding to ZTC and PTC)(different current slopes), respectively, for example, may be weighted and/or added (mixed) or combined to generate various selectable or programmable bias current slopes, such as slopes 512, 514, 516, 518, etc. The term mixed here may refer to a combining or addition process, for example. The bias currents $I_1$ and $I_2$, for example, may be weighted and then combined or added so as to provide a specific value of $g_{mB}$ that may be substantially proportional with temperature or increase in temperature. By combining the bias currents $I_1$ and $I_2$, a variable or programmable value of $g_{mB}$ may be obtained such that the product $g_{mB}*Rp$ may be substantially constant value across temperature, or a value that may provide a stable circuit or stable Q-enhancement over a range of temperatures, for example.

FIG. 5B is a diagram illustrating slopes of $g_{mB}*Rp$ for a Q-enhancement cell according to an example embodiment. As shown in FIG. 5, an oscillation or unstable operation may occur for $g_{mB}*Rp>1$, which may occur for the negative slope 530 for some relatively low temperatures, for example. In an example embodiment, by combining or adding weighted combinations of the currents $I_1$ and $I_2$, a value of $g_{mB}$ may be selected or provided (e.g., based on a digital control signal) such that the product $g_{mB}*Rp$ may provide a positive slope 534 or a substantially constant slope, or other slope, that may be more likely to provide a stable operation for the circuit or Q-enhancement cell over a range of temperatures or over a wider range of temperatures, for example. Thus, in this example shown in FIG. 5B, the slope 532 is at a substantially constant value that is, for example, less than 1, so as to provide stable operation. Likewise, the slope 532, although not constant, is closer to a constant value than slope 530, and therefore, may provide a stable circuit operation over a wider range of temperatures.

FIG. 6 is a diagram illustrating a variable or programmable bias current source for a Q-enhancement cell, which provides a variable bias current slope. The current source 600 may include a first variable bias current source 602 which may provide the bias current $I_1$, and which may be associated with bias current slope for ZTC. Current source 600 may include a second bias current source 604 which may provide the bias current $I_2$, and which may be associated with bias current slope for PTC. The current source 602 may allow a weighting of the current $I_1$, e.g., via one or more transistors and/or switches that may operate based on a digital control signal. Similarly, current source 604 may allow a weighting of the current $I_2$, e.g., via one or more transistors and/or switches that may operate based on the digital control signal. The weighted currents may be added or combined by combiner 606.

Mixing or combining weighted combinations of $I_1$ and $I_2$ (e.g., where $I_1$ and $I_2$ each have a different bias current slope) may allow generation of various bias current slopes for a Q-enhancement cell, such as bias current slopes between ZTC (such as a substantially constant slope versus temperature) and PTC (which may provide a relatively high or positive slope versus temperature). For example, $4I_1$ (from current source 602) may be added or combined with $1I_2$ (from current source 604) to provide the programmable bias current slope 512, which is more heavily weighted towards the current slope for $I_1$ (due to a higher weighting factor of 4 for $I_1$, versus a lower weighting factor of 1 for $I_1$). Similarly, equal weighting factors of 2 may be selected by current sources 602 and 604 (e.g., $2I_1$ and $2I_2$) to provide a current slope (514 or 516) that may have a bias current slope that is approximately half way between the PTC and ZTC current slopes, as an example. In this manner, different bias current slopes for the Q-enhancement cell may be obtained by weighting and/or combining the different bias currents from different bias current sources, with each of the bias current sources providing a different bias current slope. This may allow a variable or programmable bias current ($I_B$) slope to be obtained for the Q-enhancement cell, thereby allowing selection of a variable transconductance ($g_{mB}$) of the Q-enhancement cell.

Figure 7:
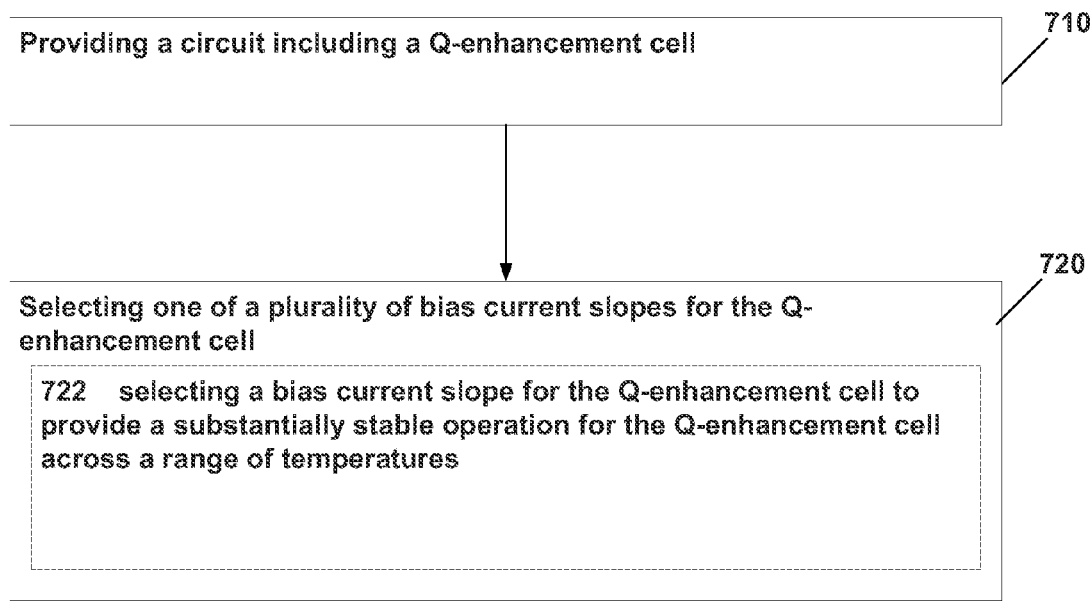
FIG. 7 is a flow chart illustrating operation according to an example embodiment.

FIG. 7 is a flow chart illustrating operation according to an example embodiment. At 710, a circuit may be provided. The circuit may include a Q-enhancement cell.

At 720, one of a plurality of bias current slopes may be selected for the Q-enhancement cell. For example, the selecting operation 720 may include a selecting operation 722, which may include selecting a bias current slope for the Q-enhancement cell to provide a substantially stable operation for the Q-enhancement cell across a range of temperatures. For example, a bias current slope for a Q-enhancement cell may be selected such that $g_{mB}*Rp$ may be less than a predetermined value across a range of temperatures, or to provide a substantially stable operation of the circuit or Q-enhancement cell across a range of temperatures, for example.

In addition, as noted above with respect to FIG. 1, switched capacitor arrays 116, 118 may each include one or more switched capacitors (e.g., one or more capacitors coupled to ground via a switch), to allow the amplifier 110 to be tuned to operate at one of a plurality of channels or frequencies, for example. Switched capacitor array 116 may include a capacitor of capacitance C coupled to ground via a switch X1, a capacitor of capacitance 2C coupled to ground via a switch X2, a capacitor of capacitance 4C coupled to ground via a switch X4, and a capacitor of capacitance 8C coupled to ground via a switch X8. Each of the switches may be implemented as a MOS transistor, for example. As a result, each of the switches may introduce a resistance when closed or On, and the total resistance of the group of one or more On switches may be referred to as $R_{ON}$.

Channel selection for the amplifier may be performed by selectively opening or closing one or more of the switches in the switched capacitor arrays to adjust the variable capacitance. The selected or tuned frequency may, for example, be represented as: w=frequency=$1/[\text{square-root}(LC_{variable})]$. The Q (quality factor) of the switched capacitor arrays 116, 118 may be represented as: $Q_{sw.\ cap.\ array}=1/wCR_{ON}$. In an example embodiment, the inductor 112 and the switched capacitor arrays may be in parallel. The effective or overall Q of the circuit or amplifier, including the Q due to the inductor 112 and the Q from the switched capacitor arrays 116, 118, may be represented as: Qeff=$Q_{inductor}//Q_{sw.\ cap.\ array}$. Therefore, the $Q_{sw.\ cap.\ array}$ may typically degrade or decrease the Q of the inductor 112 ($Q_{inductor}$).

Therefore, according to an example embodiment, the Q-enhancement cell 140 (FIGS., 1, 2) may be used to compensate for the decrease in Q due to the switched capacitor array used for channel or frequency selection for the amplifier 110, for example. For example, a bias current ($I_B$) of the Q-enhancement cell 140 or NEG-Gm cell 240 may be adjusted to increase the transconductance ($g_{mB}$) of the NEG-Gm cell 240, and thereby increase the overall Q. For example, by increasing the bias current ($I_B$) of the NEG-Gm cell, this may increase the effective resistance (Reff) of the circuit, thereby increasing the effective gain and effective Q of the amplifier or circuit. In this manner, for example, the bias current of the NEG-Gm cell may be adjusted to compensate for the Q degradation due to the switched capacitor array(s) 116, 118 used for channel or frequency selection.

For example, a channel may be selected for circuit operation by configuring one or more switched capacitors. Then, a Q-enhancement cell may be configured to compensate for a Q degradation due to the configuring of the one or more switched capacitors. A different bias current may be used for the Q-enhancement cell to compensate for Q degradation for different configurations of the switched capacitor array. As noted above, the variable capacitance C and the resistance ($R_{ON}$) may vary based on the switches that are open or closed.

Therefore, to compensate (Q-degradation compensation) for a variable configuration of the switched capacitor array, in an example embodiment, the bias current may be varied or adjusted for different switched capacitor settings or configurations. For example, as more capacitors in the switched capacitor array are enabled (switched on), the NEG-Gm cell bias current may be increased, thereby increasing the negative transconductance and effective output impedance of the LC tank for the circuit. In this manner, the gain for the circuit may be maintained, even though different channels or frequencies may be selected by enabling different capacitors, for example.

Figure 8:
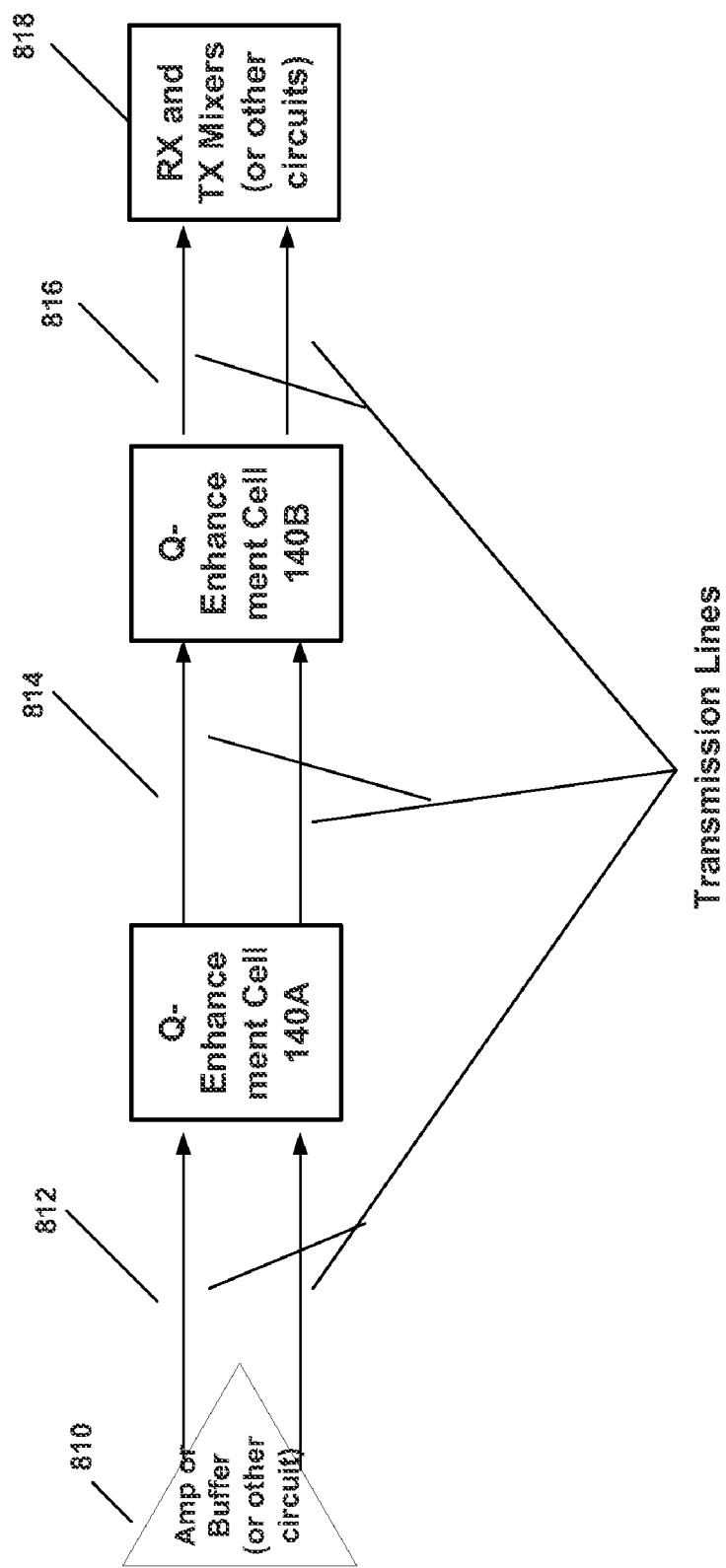
FIG. 8 is a diagram illustrating use of Q-enhancement cells to compensate for Q degradation due to transmission lines.

FIG. 8 is a diagram illustrating use of Q-enhancement cells to compensate for Q degradation due to transmission lines. A buffer 810 (or amplifier or other circuit) is coupled to mixers 818 (e.g., receive and transmit mixers), or other circuits. The transmission line between circuits 810 and 818 may include one or more transmission line segments, such as segments 812, 814 and 816, as examples. Transmission lines are lossy, and therefore may typically decrease the Q of the tank of the circuit (e.g., of amplifier 110). For example, a buffer in an LO generation signal path may drive, for example, a transmission line of, say, 500-1000 µm. Such transmission lines may decrease or degrade the Q of the circuit or amplifier, resulting in signal loss.

Therefore one or more Q-enhancement cells 140 (e.g., NEG-Gm cells 240) may be coupled to the transmission line to compensate for the Q degradation due to the transmission line. For example, the transmission line of 1000 µm may be broken into 250 µm transmission line segments. A Q-enhancement cell, such as a NEG-Gm cell, may be coupled between segments, e.g., every 250 µm, which may compensate for the Q degradation for each segment. More generally, as shown in FIG. 8, a Q-enhancement cell 140A may be coupled between transmission line segments 812 and 814, and Q-enhancement cell 140B may be coupled between segments 814 and 816, to provide compensation for Q degradation due to transmission line segments 812, 814 and 816.

According to an example embodiment, a transmission line may be provided between first and second circuits. The Q degradation due to the transmission lines may be at least partially compensated for by using a Q-enhancement cell coupled to the transmission line. In one example embodiment, the transmission line may be divided into a plurality of segments. Each of a plurality of Q-enhancement cells may be coupled to one or more transmission line segments. For example, a Q-enhancement cell may be coupled between two transmission line segments. In an example embodiment, the bias current for the Q-enhancement cell may be adjusted to provide a Q boost or enhancement based on the loss or Q degradation due to the associated transmission line or segment, for example.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising:
   a first circuit;
   a second circuit;
   a transmission line coupled between the first circuit and the second circuit; and
   a Q-enhancement cell coupled to the transmission line, wherein the Q-enhancement cell includes an adjustable bias current that is adjusted to provide a Q-enhancement based on the Q degradation of the transmission line.

2. The apparatus of claim 1, wherein the first circuit comprises a buffer.

3. The apparatus of claim 1, wherein the first circuit comprises an amplifier circuit.

4. The apparatus of claim 1, wherein the second circuit comprises at least one of a receive mixer circuit and a transmit mixer circuit.

5. The apparatus of claim 1, wherein:
   the first circuit comprises a buffer, and
   the second circuit comprises at least one of a receive mixer circuit and a transmit mixer circuit.

6. The apparatus of claim 1, wherein:
   the transmission line is broken into at least first and second transmission line segments,
   the first transmission line segment is coupled between the first circuit and the Q-enhancement cell, and
   the second transmission line segment is coupled between the Q-enhancement cell and the second circuit.

7. The apparatus of claim 1, wherein:
   the transmission line comprises a first transmission line broken into at least first and second transmission line segments, and a second transmission line,
   the first transmission line segment is coupled between the first circuit and the Q-enhancement cell,
   the second transmission line segment is coupled between the Q-enhancement cell and the second circuit, and
   the second transmission line is coupled between the first circuit and the second circuit.

8. The apparatus of claim 1, wherein the transmission line comprises a plurality of line segments and wherein the Q-enhancement cell comprises a plurality of Q-enhancement cells, wherein each of the plurality of Q-enhancement cells includes a separately adjustable bias current adjusted to provide a Q-enhancement to compensate for a Q degradation caused by a respective one of the line segments.

9. The apparatus of claim 1, wherein the Q-enhancement cell comprises a NEG-Gm cell.

10. The apparatus of claim 1, wherein:
    the transmission line comprises a plurality of transmission line segments coupled in series between the first circuit and second circuit; and
    the Q-enhancement cell comprises a plurality of Q-enhancement cells, each of the Q-enhancement cells coupled to one or more of the transmission line segments to compensate for Q degradation caused by the transmission line.

11. A method comprising:
    providing a transmission line between first and second circuits; and
    compensating for Q degradation due to the transmission lines by using a Q-enhancement cell coupled to the transmission line, wherein the Q-enhancement cell includes an adjustable bias current that is adjusted to provide a Q-enhancement based on the Q degradation of the transmission line.

12. The method of claim 11, wherein the providing the transmission line comprises providing the transmission line between a buffer and a mixer circuit.

13. The method of claim 11, wherein the providing the transmission line comprises providing the transmission line between an amplifier circuit and a mixer circuit.

14. The method of claim 11, wherein the Q-enhancement cell comprises a NEG-Gm cell.

15. A method comprising compensating for Q degradation in a circuit due to a transmission line by coupling each of a plurality of Q-enhancement cells to one or more transmission line segments, wherein each of the plurality of Q-enhancement cells includes an adjustable bias current adjusted to provide a Q-enhancement to compensate for a Q degradation caused by a respective one of the line segments.

16. The method of claim 15, wherein each of the Q-enhancement cells comprises a NEG-Gm cell.

* * * * *